(12) United States Patent
Kim et al.

(10) Patent No.: US 9,087,698 B2
(45) Date of Patent: Jul. 21, 2015

(54) BEAM SHAPERS, ANNEALING SYSTEMS EMPLOYING THE SAME, METHODS OF HEAT TREATING SUBSTRATES AND METHODS OF FABRICATING SEMICONDUCTOR DEVICES

(71) Applicants: Sanghyun Kim, Daejeon (KR); Chalykh Roman, Suwon-si (KR); Jongju Park, Hwaseong-si (KR); Donggun Lee, Hwaseong-si (KR); Seongsue Kim, Seoul (KR)

(72) Inventors: Sanghyun Kim, Daejeon (KR); Chalykh Roman, Suwon-si (KR); Jongju Park, Hwaseong-si (KR); Donggun Lee, Hwaseong-si (KR); Seongsue Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 297 days.

(21) Appl. No.: 13/790,573

(22) Filed: Mar. 8, 2013

(65) Prior Publication Data
US 2014/0076867 A1 Mar. 20, 2014

(30) Foreign Application Priority Data
Sep. 19, 2012 (KR) ........................ 10-2012-0104116

(51) Int. Cl.
| | |
|---|---|
| B23K 26/06 | (2014.01) |
| B23K 26/073 | (2006.01) |
| H01L 21/027 | (2006.01) |
| B23K 26/00 | (2014.01) |
| B23K 26/02 | (2014.01) |
| G03F 1/24 | (2012.01) |
| G02B 27/09 | (2006.01) |

(52) U.S. Cl.
CPC ........ *H01L 21/0275* (2013.01); *B23K 26/0081* (2013.01); *B23K 26/023* (2013.01); *B23K 26/06* (2013.01); *B23K 26/0639* (2013.01); *B23K 26/073* (2013.01); *G02B 27/0927* (2013.01); *G02B 27/0955* (2013.01); *G02B 27/0977* (2013.01); *G02B 27/0988* (2013.01); *G03F 1/24* (2013.01)

(58) Field of Classification Search
CPC ............................. B23K 26/06; B23K 26/073
USPC ............. 219/121.61, 121.65, 121.73–121.75; 250/492.1, 492.2, 492.22, 503.1, 504 R
See application file for complete search history.

(56) References Cited

U.S. PATENT DOCUMENTS 4,410,237 A * 10/1983 Veldkamp ..................... 359/572
6,566,023 B2 5/2003 Wang et al.
(Continued)

FOREIGN PATENT DOCUMENTS

| KR | 1020090056671 | 6/2009 |
|---|---|---|
| KR | 1020090091474 | 8/2009 |

(Continued)

*Primary Examiner* — Samuel M Heinrich
(74) *Attorney, Agent, or Firm* — Onello & Mello, LLP

(57) ABSTRACT

A treatment system comprises an energy source that generates a energy beam that is emitted along an energy beam pathway. A beam section shaper is positioned along the energy beam pathway that receives an incident energy beam and modifies a section shape thereof to output a shape-modified energy beam. A beam intensity shaper is positioned along the energy beam pathway that receives an incident energy beam having a first intensity profile and outputs an intensity-modified energy beam having a second intensity profile, wherein the first intensity profile has a relative maximum average intensity at a center region thereof and wherein the second intensity profile has a relative minimum average intensity at a center region thereof.

28 Claims, 14 Drawing Sheets

(56) References Cited

U.S. PATENT DOCUMENTS

| | | |
|---|---|---|
| 6,835,510 B2 | 12/2004 | Chen et al. |
| 7,397,546 B2 | 7/2008 | Weber et al. |
| 8,158,904 B2 * | 4/2012 | Weber et al. ............ 219/121.71 |
| 2004/0066569 A1 * | 4/2004 | Taniguchi .................... 359/883 |
| 2013/0122404 A1 | 5/2013 | Park et al. |

FOREIGN PATENT DOCUMENTS

| | | |
|---|---|---|
| KR | 101095042 | 12/2011 |
| KR | 1020130067331 | 6/2013 |

* cited by examiner

| W:L | Duration (ms) | Ic/Io | Ix/Io | Iy/Io |
|---|---|---|---|---|
| 1:2 | 0.1 | 1.61 | 1.33 | 1.33 |
| 1:2 | 100 | 9.95 | 4.24 | 4.85 |
| 1:10 | 0.1 | 4.53 | 1.34 | 4.10 |
| 1:10 | 100 | 15.00 | 2.60 | 9.00 |

US 9,087,698 B2

BEAM SHAPERS, ANNEALING SYSTEMS EMPLOYING THE SAME, METHODS OF HEAT TREATING SUBSTRATES AND METHODS OF FABRICATING SEMICONDUCTOR DEVICES

CROSS-REFERENCE TO RELATED APPLICATIONS

This U.S. non-provisional patent application claims priority under 35 U.S.C. §119 to Korean Patent Application No. 10-2012-0104116, filed on Sep. 19, 2012, in the Korean Intellectual Property Office, the entire contents of which are hereby incorporated by reference.

BACKGROUND

In the fabrication of semiconductor devices, there is a continued trend toward increased integration. Accordingly, there is an increased demand for forming patterns of ever-reduced scale on semiconductor substrates. In order to satisfy this demand, the wavelength of the light source used in photolithography to form patterns on semiconductor devices, has become shorter. For example, in the past, photolithography processes have utilized light sources having a g-line wavelength band (e.g., approximately 436 nm) or an i-line wavelength band (e.g., approximately 365 nm). With the demands of higher integration, the use of light sources having a deep-ultraviolet wavelength band (e.g., ArF laser) continues to become more prevalent. Even further, it is likely that photolithography processes utilizing light sources having an extreme-ultraviolet (EUV) wavelength band may soon become popular.

SUMMARY

The present disclosure relates to a optical components configured to modify an intensity distribution of an incident energy beam. The present disclosure further relates to heat treatment systems that utilize such optical components. The present disclosure further relates to methods of heat treating a substrate. The present disclosure further relates to methods of heat treating reflective photomasks. The present disclosure further relates to methods of forming semiconductor devices using heat-treated photomasks.

In an aspect, a treatment system comprises: an energy source that generates a energy beam that is emitted along an energy beam pathway; a beam section shaper positioned along the energy beam pathway that receives an incident energy beam and modifies a section shape thereof to output a shape-modified energy beam; and a beam intensity shaper positioned along the energy beam pathway that receives an incident energy beam having a first intensity profile and outputs an intensity-modified energy beam having a second intensity profile, wherein the first intensity profile has a relative maximum average intensity at a center region thereof and wherein the second intensity profile has a relative minimum average intensity at a center region thereof.

In some embodiments, the treatment system further comprises: a stage positioned along the energy beam pathway at which a substrate is positioned and at which the intensity-modified energy beam is incident.

In some embodiments, the stage is constructed and arranged to receive a substrate.

In some embodiments, the substrate comprises one or more of a photomask and wafer.

In some embodiments, the substrate comprises a chip.

In some embodiments, the stage is constructed and arranged to receive a substrate comprising a multiple-layer absorber-type Mo/Si photomask in turn constructed and arranged for use in an extreme ultraviolet (EUV) reflective-type photolithographic process.

In some embodiments, the intensity-modified energy beam incident at the substrate causes a heat treatment of a target region of the substrate.

In some embodiments, the heat treatment imparts heating of the substrate to a first temperature that is substantially constant in the target region.

In some embodiments, the first temperature is greater than a temperature required to melt a first material on the substrate.

In some embodiments, the first material is an Si layer that is melted as a result of heating to the first temperature.

In some embodiments, the first temperature is less than a temperature required to melt a second material on the substrate.

In some embodiments, the second material is an Mo layer that is not melted as a result of heating to the first temperature In some embodiments, the heat treatment results in heating of the substrate to a second temperature that is less than the first temperature in a region beyond the target region.

In some embodiments, the second temperature is less than a temperature required to melt a material on the substrate.

In some embodiments, the beam section shaper comprises an optical element selected from the group consisting of a lens, a reflector, a diffractive optical element (DOE), a spatial light modulator (SLM), and a digital mirror device (DMD).

In some embodiments, the beam intensity shaper comprises an optical element selected from the group consisting of: a lens, a reflector, a diffractive optical element (DOE), a spatial light modulator (SLM), and a digital mirror device (DMD).

In some embodiments, the energy source comprises a laser source and wherein the energy beam is a laser beam.

In some embodiments, the energy beam incident at the beam intensity shaper has an intensity distribution such that an intensity at a center region is greater than an intensity at an edge region thereof.

In some embodiments, the energy beam incident at the beam intensity shaper has a Gaussian intensity distrib1f.

In some embodiments, the intensity-modified energy beam has an intensity distribution that is concave.

In some embodiments, the concave intensity distribution has a first average intensity at the edge region and a second average intensity at the center region and wherein the first average intensity is about 1.3 to about 15 times the second average intensity.

In some embodiments, the second intensity is sufficient for melting a material on a substrate at which the intensity-modified energy beam is incident.

In some embodiments, the shape-modified energy beam output by the beam section shaper is incident on the beam intensity shaper In some embodiments, the intensity-modified energy beam output by the beam intensity shaper is incident on the beam section shaper In some embodiments, the second intensity profile of the intensity-modified energy beam output by the beam intensity shaper has an oscillating distribution with local maxima and local minima.

In some embodiments, the local minima of the second intensity profile is positioned in an edge region of the second intensity profile and wherein the local minima is less than the relative minimum average intensity at the center region thereof.

In some embodiments, the local maxima of the second intensity profile is positioned in an edge region of the second intensity profile and wherein the local maxima is greater than an average intensity at the edge region.

In some embodiments, the average intensity at the edge region of the second intensity profile is determined according to a curve fitting of the oscillating profile.

In another aspect, a beam intensity shaper is constructed and arranged to receive an incident energy beam having a first intensity profile and to output an intensity-modified energy beam having a second intensity profile, wherein the first intensity profile has a relative maximum average intensity at a center region thereof and wherein the second intensity profile has a relative minimum average intensity at a center region thereof.

In some embodiments, the beam intensity shaper comprises an optical element selected from the group consisting of: a lens, a reflector, a diffractive optical element (DOE), a spatial light modulator (SLM), and a digital mirror device (DMD).

In some embodiments, the energy beam incident at the beam intensity shaper has an intensity distribution such that an average intensity at a center region is greater than an average intensity at an edge region thereof.

In some embodiments, the energy beam incident at the beam intensity shaper has a Gaussian intensity distribution In some embodiments, the intensity-modified energy beam has an intensity distribution that is concave.

In some embodiments, the concave intensity distribution has a first intensity at the edge region and a second intensity at the center region and wherein the first intensity is about 1.3 to about 15 times the second intensity.

In some embodiments, the second intensity is sufficient for melting a material on a substrate at which the intensity-modified energy beam is incident.

In some embodiments, the second intensity profile of the intensity-modified energy beam output by the beam intensity shaper has an oscillating distribution with local maxima and local minima.

In some embodiments, the local minima of the second intensity profile is positioned in an edge region of the second intensity profile and wherein the local minima is less than the relative minimum average intensity at the center region thereof.

In some embodiments, the local maxima of the second intensity profile is positioned in an edge region of the second intensity profile and wherein the local maxima is greater than an average intensity at the edge region.

In some embodiments, the average intensity at the edge region of the second intensity profile is determined according to a curve fitting of the oscillating profile.

In another aspect, a method of treating a substrate comprises: generating a energy beam at an energy source; receiving the energy beam at a beam section shaper that modifies a section shape thereof to output a shape-modified energy beam; receiving the energy beam at a beam intensity shaper, the received energy beam having a first intensity profile, the beam intensity shaper outputting an intensity-modified energy beam having a second intensity profile, wherein the first intensity profile has a relative maximum average intensity at a center region thereof and wherein the second intensity profile has a relative minimum average intensity at a center region thereof; and applying the intensity-modified energy beam to a substrate positioned at a stage, the intensity-modified energy beam incident at the substrate for treating the substrate.

In some embodiments, the method further comprises controlling a duration of applying the intensity-modified energy beam to the substrate In some embodiments, the duration of applying the intensity-modified energy beam is determined based on relative melting points of Si and Mo.

In some embodiments, the duration of applying the intensity-modified energy beam is determined to selectively melt Si present in the substrate, while avoiding melting of Mo present in the substrate.

In some embodiments, the substrate comprises one or more of a photomask and wafer.

In some embodiments, the substrate comprises a chip

In some embodiments, the substrate comprises a photomask in turn constructed and arranged for use in an extreme ultraviolet (EUV) photolithographic process.

In some embodiments, the stage is constructed and arranged to receive a substrate comprising a multiple-layer absorber-type Mo/Si photomask in turn constructed and arranged for use in an extreme ultraviolet (EUV) reflective-type photolithographic process.

In some embodiments, the intensity-modified energy beam incident at the substrate for treating the substrate causes a heat treatment of a target region of the substrate.

In some embodiments, the heat treatment imparts heating of the substrate to a first temperature that is substantially constant in the target region.

In some embodiments, the first temperature is greater than a temperature required to melt a material on the substrate.

In some embodiments, the heat treatment results in heating of the substrate to a second temperature that is less than the first temperature in a region beyond the target region.

In some embodiments, the second temperature is less than a temperature required to melt a material on the substrate.

In some embodiments, the energy source comprises a laser source and wherein the energy beam is a laser beam.

In some embodiments, the energy beam incident at the beam intensity shaper has an intensity distribution such that an intensity at a center region is greater than an intensity at an edge region thereof.

In some embodiments, the energy beam incident at the beam intensity shaper has a Gaussian intensity distribution In some embodiments, the intensity-modified energy beam has an intensity distribution that is concave In some embodiments, the concave intensity distribution has a first average intensity at the edge region and a second average intensity at the center region and wherein the first intensity is about 1.3 to about 15 times the second intensity.

In some embodiments, the second intensity is sufficient for melting a material on a substrate at which the intensity-modified energy beam is incident.

In some embodiments, the shape-modified energy beam output by the beam section shaper is received by the beam intensity shaper.

In some embodiments, the intensity-modified energy beam output by the beam intensity shaper is received by the beam section shaper.

In some embodiments, the second intensity profile of the intensity-modified energy beam output by the beam intensity shaper has an oscillating distribution with local maxima and local minima.

In some embodiments, the local minima of the second intensity profile is positioned in an edge region of the second intensity profile and wherein the local minima is less than the relative minimum average intensity at the center region thereof.

In some embodiments, the local maxima of the second intensity profile is positioned in an edge region of the second intensity profile and wherein the local maxima is greater than an average intensity at the edge region.

In some embodiments, the average intensity at the edge region of the second intensity profile is determined according to a curve fitting of the oscillating profile.

In another aspect, a method of heat treating a EUV photomask comprises: assigning contiguous regions of a EUV photomask to be heat treated with a corresponding prescribed heat treatment; and for each of the contiguous regions: generating a energy beam at an energy source for a duration determined by the corresponding prescribed heat treatment; receiving the energy beam at a beam intensity shaper, the received energy beam having a first intensity profile, the beam intensity shaper outputting an intensity-modified energy beam having a second intensity profile, wherein the first intensity profile has a relative maximum average intensity at a center region thereof and wherein the second intensity profile has a relative minimum average intensity at a center region thereof; and applying the intensity-modified energy beam to the EUV photomask positioned at a stage, the intensity-modified energy beam incident at the region of the EUV photomask for heat-treating the region of the EUV photomask, the heat treatment causing melting of a metal material present in the region to modify a reflectance parameter of the region; thereby modifying a reflectance profile of multiple contiguous regions of the EUV photomask.

In some embodiments, modifying a reflectance profile of multiple contiguous regions of the EUV photomask results in a photomask having improved reflectance uniformity among the regions.

In some embodiments, the duration of applying the intensity-modified energy beam is determined based on relative melting points of Si and Mo.

In some embodiments, the duration of applying the intensity-modified energy beam is determined to selectively melt Si present in the region of the EUV photomask, while avoiding melting of Mo present in the region of the EUV photomask.

In some embodiments, the photomask is constructed and arranged for use in an extreme ultraviolet (EUV) photolithographic process.

In some embodiments, the intensity-modified energy beam has an intensity distribution that is concave.

In another aspect, a method of forming a semiconductor device comprises: forming a EUV photomask; assigning contiguous regions of the EUV photomask to be heat treated with a corresponding prescribed heat treatment; for each of the contiguous regions: generating a energy beam at an energy source for a duration determined by the corresponding prescribed heat treatment; receiving the energy beam at a beam intensity shaper, the received energy beam having a first intensity profile, the beam intensity shaper outputting an intensity-modified energy beam having a second intensity profile, wherein the first intensity profile has a relative maximum average intensity at a center region thereof and wherein the second intensity profile has a relative minimum average intensity at a center region thereof; and applying the intensity-modified energy beam to the reflective photomask positioned at a stage, the intensity-modified energy beam incident at the region of the reflective photomask for heat-treating the region of the reflective photomask, the heat treatment causing melting of a metal material present in the region to modify a reflectance parameter of the region; thereby modifying a reflectance profile of multiple contiguous regions of the reflective photomask; and using the photomask in a photolithographic process to form a semiconductor device.

In some embodiments, the photolithographic process is an extreme ultraviolet (EUV) photolithographic process.

In some embodiments, the semiconductor device formed by the photolithographic process comprises a wafer.

In some embodiments, the semiconductor device formed by the photolithographic process comprises a chip.

According to example embodiments of the inventive concepts, a laser annealing system may include a light source generating a laser beam, a stage configured to load a target object, and a beam shaper provided on a propagation path of the laser beam. The beam shaper may include a beam intensity shaper configured to convert an incident beam into an emission beam with a substantially concave intensity distribution.

In example embodiments, the beam intensity shaper may include at least one of a diffractive optical element (DOE), a spatial light modulator (SLM), a digital mirror device, or a lens.

In example embodiments, the emission beam has a first intensity at a center thereof, and the light source and the beam intensity shaper may be configured in such a way that the first intensity of the emission beam has a power density of 0.5 $kW/cm^2$ to 10 $kW/cm^2$.

In example embodiments, the emission beam has a second intensity at an edge thereof, and the beam intensity shaper may be configured to realize the second intensity that is about 1.3 to about 15 times the first intensity.

In example embodiments, the target object may be a reflective photomask or a wafer.

In example embodiments, the emission beam exhibits an intensity profile oscillating as a function of distance from a center thereof, and an intensity curve of the emission beam interpolated to preserve monotonicity has the minimum at a center of the emission beam.

In example embodiments, the beam shaper may further include a beam section shaper modifying a sectional profile of the laser beam that is incident thereto.

In example embodiments, the beam section shaper may be provided between the light source and the beam intensity shaper.

According to example embodiments of the inventive concepts, a beam shaper may include an optical element causing a change in intensity spatial distribution between an incident beam and an emission beam. The optical element may be configured in such a way that the emission beam has a lower intensity at a center thereof than at an edge thereof.

In example embodiments, the optical element may include at least one of a diffractive optical element (DOE), a spatial light modulator (SLM), a digital mirror device, or a lens.

In example embodiments, the optical element may be configured in such a way that an intensity curve of the emission beam interpolated to preserve monotonicity has the minimum at a center of the emission beam.

In example embodiments, the optical element may be configured in such a way that the emission beam exhibits an intensity profile oscillating as a function of distance from a center thereof, and an intensity curve of the emission beam interpolated to preserve monotonicity has the minimum at a center of the emission beam.

In example embodiments, the emission beam may have a first intensity at a center thereof and a second intensity at an edge thereof, and the optical element may be configured to realize the second intensity that is about 1.3 to about 15 times the first intensity.

According to example embodiments of the inventive concepts, a method of fabricating a reflective photomask may include preparing a substrate provided with a multi-layered reflection structure, in which first and second layers are alternatingly stacked on each other, forming an absorption layer on the multi-layered reflection structure, patterning the absorption layer to form absorber patterns, and performing a laser annealing process. The laser annealing process may include illuminating a laser beam, whose intensity is lower at a center thereof than at an edge thereof, onto the substrate provided with the multi-layered reflection structure.

In example embodiments, an intensity curve of the laser beam interpolated to preserve monotonicity has the minimum at the center of the laser beam.

In example embodiments, the laser annealing process may be performed using the laser beam, whose intensity is oscillating as a function of distance from the center of the laser beam, and an intensity curve of the laser beam interpolated to preserve monotonicity has the minimum at the center of the laser beam.

In example embodiments, the laser beam has a first intensity at the center thereof and a second intensity at the edge thereof, and the second intensity may be about 1.3 to about 15 times the first intensity.

In example embodiments, the laser annealing process may be performed after the patterning of the absorption layer.

In example embodiments, the laser annealing process may be performed between the forming of the absorption layer and the patterning of the absorption layer.

In example embodiments, the laser annealing process may be performed between the preparing of the substrate and the forming of the absorption layer.

According to example embodiments of the inventive concepts, a method of fabricating a semiconductor device may include forming a photo-resist layer on a substrate, exposing the photo-resist layer using a reflective photomask including a portion illuminated by a laser beam, whose intensity is lower at a center thereof than at an edge thereof, developing the photo-resist layer to form a photo-resist pattern, and etching the substrate or a layer provided thereon using the photo-resist pattern as an etch mask.

BRIEF DESCRIPTION OF THE DRAWINGS

Example embodiments will be more clearly understood from the following brief description taken in conjunction with the accompanying drawings.

FIG. 1 is a block diagram illustrating an annealing system according to example embodiments of the inventive concepts.

FIG. 2 illustrates a beam section shaper according to example embodiments of the inventive concepts.

FIG. 3 illustrates a sectional profile of a beam emitted from the beam section shaper according to example embodiments of the inventive concepts.

FIG. 4 illustrates a sectional profile of a beam emitted from a beam section shaper according to example embodiments of the inventive concepts.

FIG. 5 illustrates a sectional profile of a beam emitted from a beam section shaper according to example embodiments of the inventive concepts.

FIG. 6 illustrates a sectional profile of a beam emitted from a beam section shaper according to example embodiments of the inventive concepts.

FIG. 7 illustrates a beam intensity shaper according to example embodiments of the inventive concepts.

FIG. 8 illustrates an intensity distribution of a beam emitted from the beam intensity shaper according to example embodiments of the inventive concepts.

FIG. 9 illustrates an intensity distribution of a beam emitted from the beam intensity shaper according to example embodiments of the inventive concepts.

FIG. 10 is an image of a beam emitted from the beam intensity shaper according to example embodiments of the inventive concepts.

FIG. 11 is a flow chart illustrating a method of fabricating a photomask according to an example embodiment of the inventive concepts.

FIG. 12 is a flow chart illustrating a method of fabricating a photomask according to another example embodiment of the inventive concepts.

FIG. 13 is a flow chart illustrating a method of fabricating a photomask according to another example embodiment of the inventive concepts.

FIG. 14 is a depth profile property of a photomask fabricated using a fabrication method according to example embodiments of the inventive concepts.

FIGS. 15 and 16 are a diagram and table, respectively, which are provided to describe certain aspects of a beam intensity shaper according to example embodiments of the inventive concepts.

FIG. 17 is an image of a portion of a photomask according to example embodiments of the inventive concepts.

FIG. 18 is an image of a portion of a photomask according to a comparative example.

FIG. 19 is an graph of a depth profile measured from a photomask according to example embodiments of the inventive concept.

FIG. 20 is a graph of a depth profile measured from a photomask according to the comparative example.

FIG. 21 is a schematic diagram of an exposure system according to example embodiments of the inventive concepts.

FIG. 22 is a flow chart illustrating a process of patterning a semiconductor device according to example embodiments of the inventive concepts.

Figure 1:
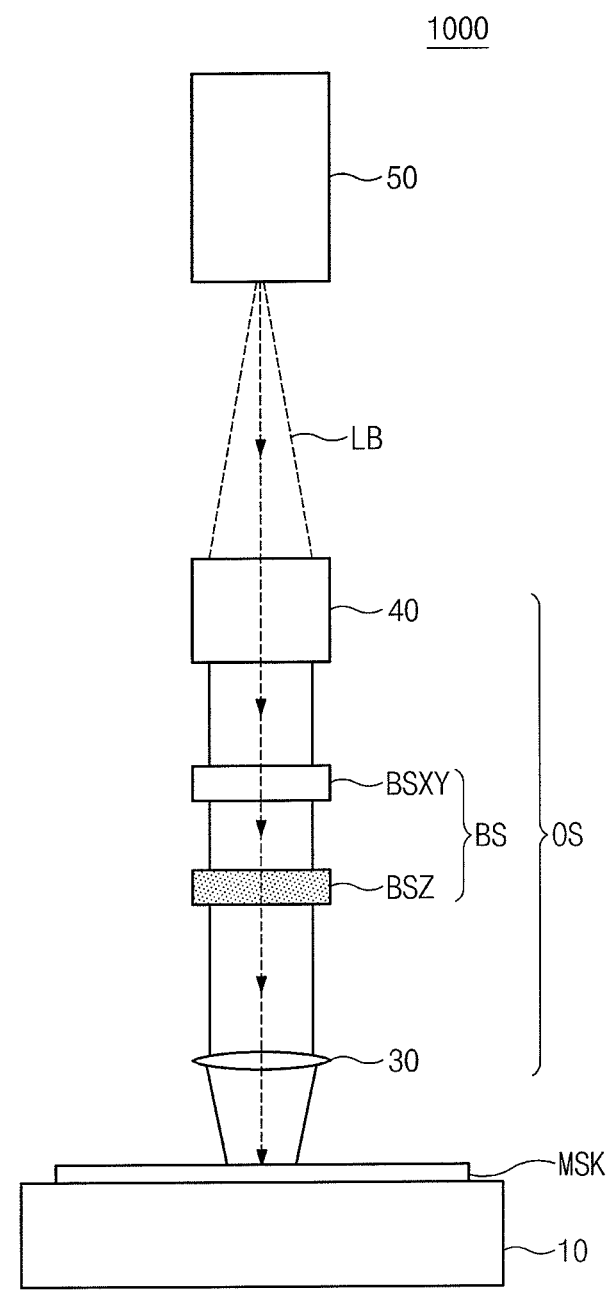
FIGS. 1 through 22 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different fauns and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

It has been observed that light having an EUV wavelength band is primarily absorbed by refractive optical materials. As a result, it has been determined that semiconductor photolithography processes that employ light energy beams at EUV wavelengths should utilize a reflective optical system, rather than a refractive optical system. Accordingly, EUV photolithography requires a reflective photomask in which circuit patterns to be transferred onto a wafer are formed on reflective surfaces. In such EUV-based reflective photomasks, it is common for a pattern of absorbent structures to be positioned on a multiple-layered substrate. In some examples, the multiple layers can include alternating layers of molybdenum and amorphous silicon, Mo/Si. After forming the mask, it is desired to heat treat selective regions of the mask to improve mask uniformity. The heat treatment causes selective melting of the amorphous silicon layers in the heated regions, thereby modifying a height of the absorbent structures in those heated regions. In this manner, uniformity in the critical dimension of different regions of the resulting chip or wafer, formed using the resulting heat-treated photomask, can be achieved.

FIG. 1 is a block diagram illustrating an annealing system according to example embodiments of the inventive concepts.

Referring to FIG. 1, an annealing system 1000 may include an energy source that generates an energy beam, for example, a light source 50 to generate laser beam LB. A stage 10 may be configured to load a target object. An optical system OS can be located along a propagation path of the laser beam LB from the light source 50 to the stage 10.

In some embodiments, the target object may comprise a photomask MSK, for example a photomask that can, in turn, be used for a photolithography process. However, the target object is not necessarily limited thereto. For example, the target object may comprise a semiconductor wafer, semiconductor chip, or other target on which a heat treatment may be desired. In example embodiments, the photomask MSK may be a reflective photomask to be used in an extreme ultraviolet light (EUV) photolithography process. For example, the photomask MSK may comprise a multi-layered structure for reflecting an extreme ultraviolet (EUV) energy beam and absorber patterns defining patterns to be copied onto the semiconductor wafer, as described herein.

The energy beam, or laser beam LB, may be generated to selectively melt at least one (e.g., a silicon layer) of layers constituting the multi-layered structure of the photomask MSK. This occurs in a processing treatment referred to herein as a heat treatment or annealing treatment. For example, in the case where the annealing system 1000 is used to induce a 1 nm thickness reduction of the multi-layered structure for about 0.1 ms, the light source 50 may be configured in such a way that a center region of the laser beam LB to be incident to the photomask MSK can have a power density of about 2.4 kW/cm$^2$. This, however, is only an example, and, in other embodiments, the power density of the center region of the laser beam LB may vary depending, for example, on the pulse duration of the laser beam, the desired recess depth of the multi-layered structure, and the like. For example, in the case where the pulse duration of the laser beam ranges from 0.1 ms to 100 ms, a power density of about 0.5-2.4 kW/cm$^2$ may be desired to achieve the 1 nm thickness reduction. Furthermore, the multi-layered structure may be recessed to a depth (e.g., of 50 nm) greater than 1 nm, and in this case, the center region of the laser beam LB may be configured to have a more increased power density. Considering these variable factors, in example embodiments, the center region of the laser beam LB may be configured to have a power density ranging from about 0.5 kW/cm$^2$ to 10 kW/cm$^2$.

The optical system OS may include at least one lens 30, a beam shaper BS, and a guide structure 40. The beam shaper BS may include a beam section shaper BSXY configured to change, or modify, a sectional profile of the laser beam LB and at least one beam intensity shaper BSZ configured to modify a spatial intensity, or intensity profile, of the laser beam LB. The operation of the beam section shaper BSXY will be described in greater detail with reference to FIGS. 2 through 6, and the operation of the beam intensity shaper BSZ will be described in greater detail with reference to FIGS. 7 through 9.

The guide structure 40 may be configured to guide the laser beam LB from the light source 50 to the stage 10. In various embodiments, the guide structure can be realized using at least one of optical components, such as a lens, a mirror, a prism, polarizer, a window, a grating, or other suitable optical component.

Figure 2:
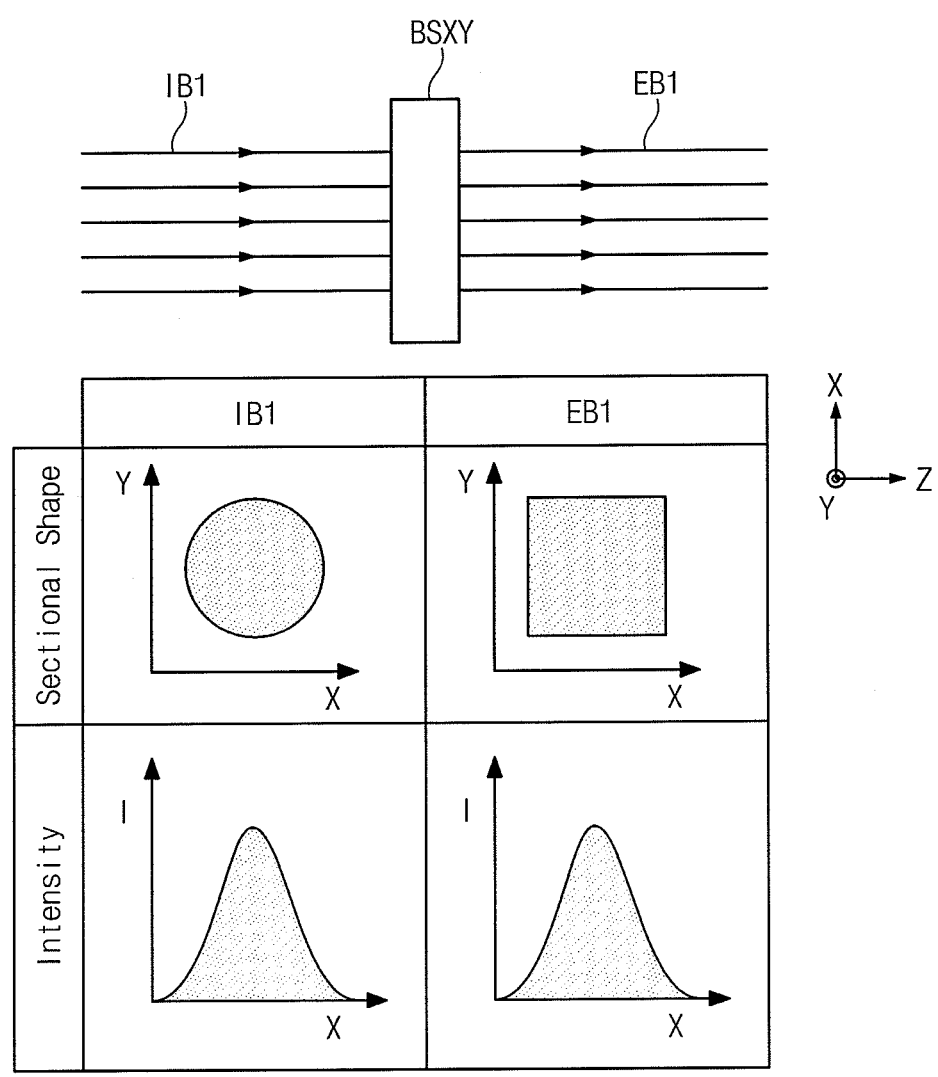

FIG. 2 illustrates a beam section shaper according to example embodiments of the inventive concepts. FIGS. 3 through 6 illustrate sectional profiles of beams emitted from the beam section shaper according to example embodiments of the inventive concepts.

Referring to FIG. 2, the beam section shaper BSXY may be configured in such a way that the laser beam LB incident thereon (hereinafter, referred to as an "incident beam IB1") has a different sectional profile, or sectional shape from that of the laser beam LB emitted therefrom (hereinafter, referred to as an "emission beam EB1"). Here, assuming the propagation direction of the laser beam LB to be parallel to the z-axis direction, the "sectional profile" of the laser beam LB may refer to the shape of the laser beam LB to be projected onto the xy plane. In other words, the sectional profile of the laser beam LB or energy beam is a cross-sectional, spatial, profile of the laser beam in the xy spatial plane.

For example, as given in the table of FIG. 2, the beam section shaper BSXY may be configured to modify the incident beam IB1 having a circular-shaped sectional profile into the emission beam EB1 having a square-shaped sectional profile. To realize the change in the sectional profile of the laser beam LB, the beam section shaper BSXY may include at least one of optical components, such as a lens, a mirror, a prism, polarizer, a window, or a grating.

Example embodiments of the inventive concepts are not limited to the example of FIG. 2, in which the emission beam EB1 is modified to have the square sectional profile. For example, in certain embodiments, the beam section shaper BSXY may be configured in such a way that the emission beam EB1 has one of a number of suitable shapes that satisfy the condition of a complete-filling when multiple ones of the sections are positioned adjacent each other. IN this manner, a complete filling is achieved when a finite, closed, treatment area is filled by repeatedly arranging a given shape, without any overlapping occurring therebetween.

Figure 3:
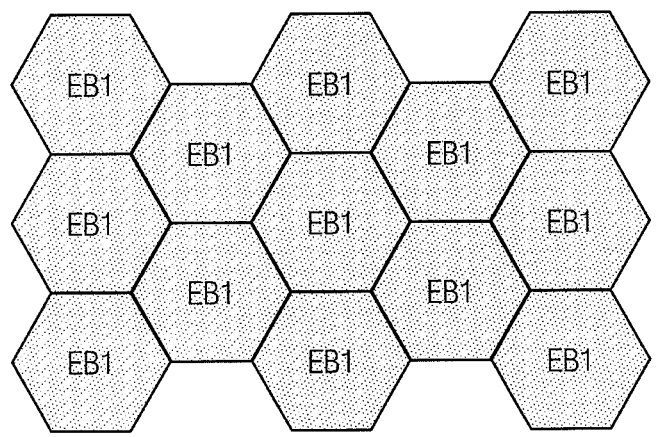
Figure 4:
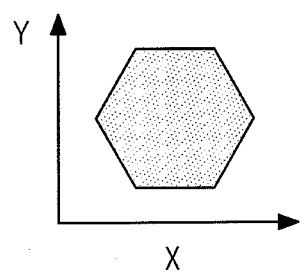
Figure 5:
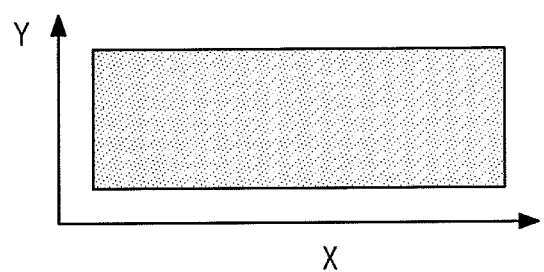

For example, as shown in FIG. 3, a specific area can be filled by regular hexagons EB1 having the same size without any overlapping or gap therebetween. In this sense, the regular hexagon is an example capable of satisfying the simplified condition of complete-filling, and the beam section shaper BSXY may be configured in such a way that the emission beam EB1 has a sectional profile that is shaped like a regular hexagon. The simplified condition of complete-filling can also be satisfied using other shapes. For example, complete-filling can be achieved where the sectional profile of the emission beam EB1 is shaped like a square, as shown in FIG. 2 or like a rectangle shown in FIG. 5. In view of this, embodiments of the inventive concepts can further include the cases of a square and rectangular sectional profile.

Figure 6:
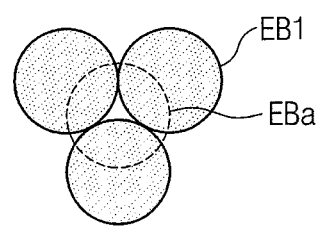

In other example embodiments, the beam section shaper BSXY may be configured in such a way that the emission beam EB1 has one of shapes satisfying a relieved condition of complete-filling, which holds that a finite closed area should be filled by repeatedly arranging a given shape with a minimized overlapping. For example, as shown in FIG. 6, a closed area cannot be filled by circles EB1 having the same size without overlapping or gap therebetween. However, gaps between the circles EB1 can be filled by adding other circles EBa. The relieved condition of a complete-filling may also refer to mean this property of the emission beam EB1 for purposes of the present disclosure.

Although example embodiments of the inventive concept are not limited thereto, in some example embodiments, as shown in FIG. 2, the beam section shaper BSXY avoids imparting any substantial change in intensity between the incident beam IB1 and the emission beam EB1. In other example embodiments, optical components constituting the beam section shaper BSXY may lead to an insignificant reduction in beam intensity; however, setting aside an insignificant, inevitable, reduction, the beam section shaper BSXY may be configured so as not to induce an intended reduction of the beam intensity. In other embodiments, some intended change in intensity may occur as a result of the beam section shaper BSXY.

Figure 7:
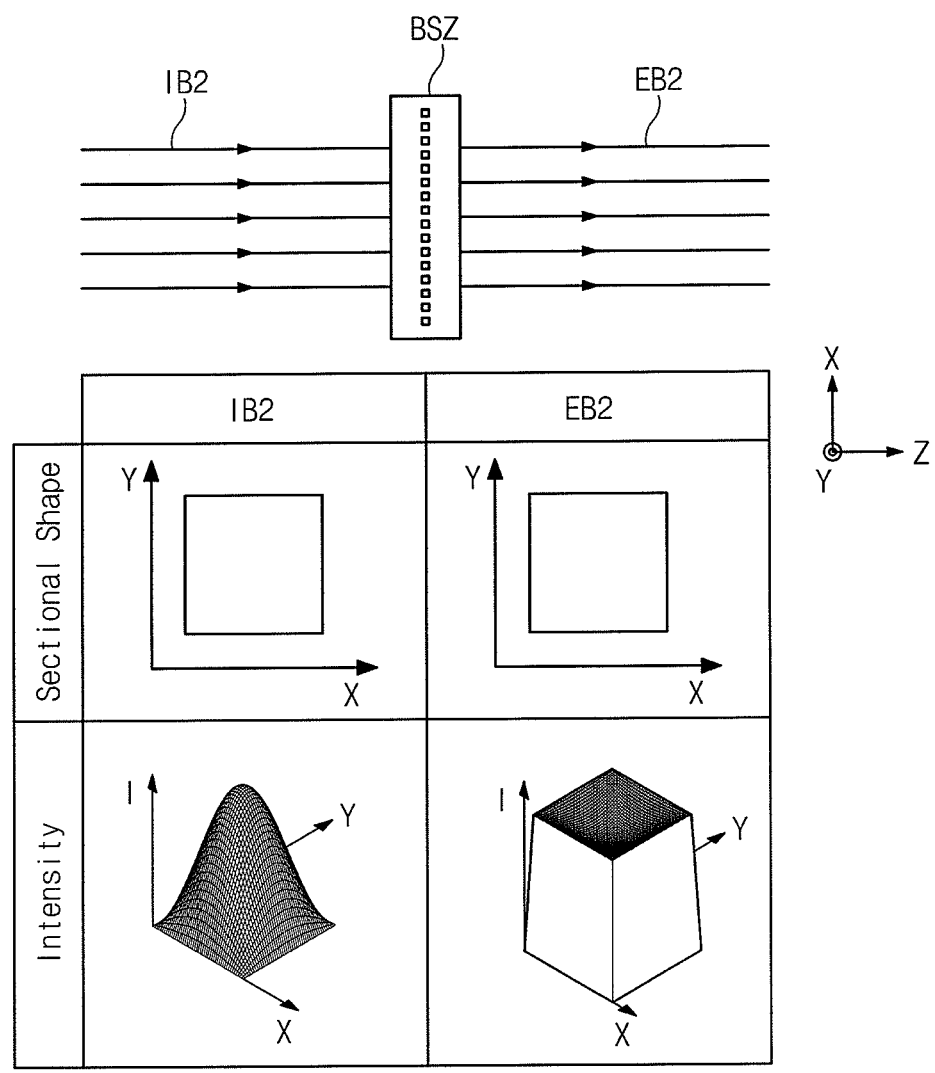

FIG. 7 illustrates a beam intensity shaper according to example embodiments of the inventive concepts.

Referring to FIG. 7, the beam intensity shaper BSZ may be configured in such a way that the laser beam LB incident thereto (hereinafter, referred to as an "incident beam IB2") has a different intensity profile from that of the laser beam LB emitted therefrom (hereinafter, referred to as an "emission beam EB2"). The beam intensity shaper BSZ therefore receives the incident energy beam IB2 having a first intensity profile and outputs an intensity-modified energy beam, emission energy beam EB2, having a second intensity profile. In some embodiments the first intensity profile of the incident energy beam IB2 has a relative maximum average intensity at a center region thereof and the second intensity profile of the emission energy beam EB2 has a relative minimum average intensity at a center region thereof.

Assuming the propagation direction of the laser beam LB to be parallel to the z-axis direction, the intensity profile of the laser beam LB may refer to an intensity of the laser beam LB in a plane represented by xy-coordinates, in other words, the spatial intensity of the laser beam relative to the XY plane. It can be seen in the FIG. 7 illustration that the intensity profile of the energy beam can be described with reference to a two-dimensional curve given by x-axis coordinates and y-axis coordinates. In various embodiments, the beam intensity shaper BSZ may be of a transmissive or reflective type. In the case of the reflective type, the emission beam EB2 may refer to the laser beam LB or energy beam as reflected from the beam intensity shaper BSZ. In the case of the transmissive type, the emission beam EB2 may refer to the laser beam LB or energy beam as transmitted through the beam intensity shaper BSZ.

According to example embodiments of the inventive concepts, the beam intensity shaper BSZ may be configured in such a way that the emission beam EB2 has a concave intensity profile that is generally downward curving in a direction from an outer region, or edge region, thereof to a center region thereof. For example, as illustrated in the table of FIG. 7, in the case where the incident beam IB2 has an intensity profile resembling a Gaussian distribution having a maximum average intensity at its center, the emission beam EB2 may have a concave intensity profile having a relative minimum average intensity at its center, and the beam intensity shaper BSZ may be configured to induce this change in intensity profile of the laser beam LB. The concave intensity profile of the emission beam EB2 and technical meanings thereof will be described in further detail with reference to FIG. 8.

Meanwhile, since the intensity profile of the emission beam EB2 results from electromagnetic or optical interaction between the incident beam IB2 and the beam intensity shaper BSZ, the resulting intensity profile of the emitted beam may depend on both of an optical property (e.g., spatial intensity) of the incident beam IB2 and a structure of the beam intensity shaper BSZ. According to example embodiments of the inventive concepts, the beam intensity shaper BSZ may be configured in such a way that the emission beam EB2 can have the concave or downward-curving intensity profile in response to the intensity profile of the incident beam IB2.

In example embodiments, the herein-described change in intensity profile of the laser beam LB may be realized using at least one of a diffractive optical element (DOE), a spatial light modulator (SLM), a digital mirror device, a lens, or other suitable element or system. In other words, the beam intensity shaper BSZ may include at least one of DOE, SLM, the digital mirror device, a lens or other suitable element or system. However, example embodiments of the inventive concept are not necessarily limited thereto.

In example embodiments, as shown in FIG. 7, the beam intensity shaper BSZ may be configured so as not to cause a substantial change in the sectional profile, or sectional shape, between the incident beam IB2 and the emission beam EB2. However, example embodiments of the inventive concept are not limited thereto, and, in some embodiments, the sectional shape can be modified by the beam intensity shaper BSZ.

Figure 8:
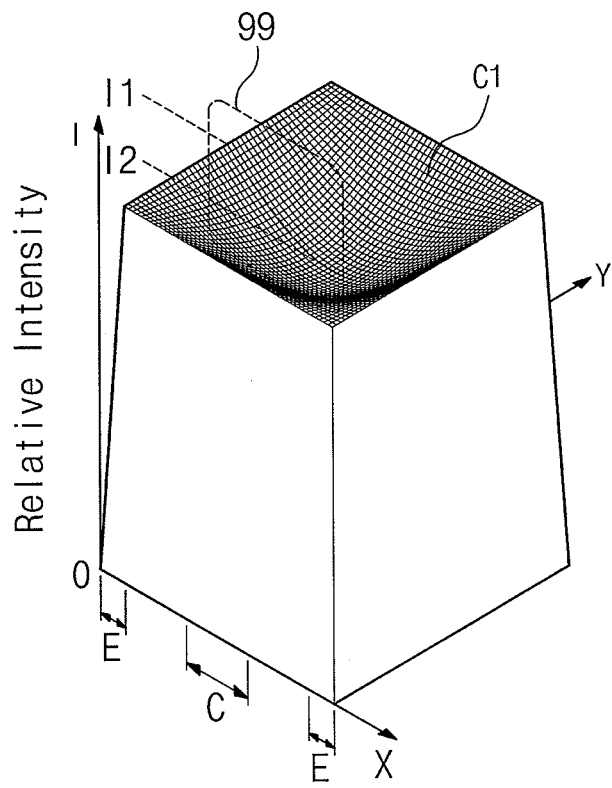

FIG. 8 illustrates an intensity distribution of a beam emitted from the beam intensity shaper according to example embodiments of the inventive concepts.

Referring to FIG. 8, the emission beam EB2 may have an intensity level that is lower at its center, inner or intermediate, region C than at its edge, outer, or perimeter region E. For example, the emission beam EB2 may have a first intensity I1 at its edge E and a second intensity I2, which may be lower at its center C, wherein the second intensity I2 is lower than the first intensity I1. In some example embodiments, within an effective section of the emission beam EB2, the second intensity I2 may be the actual minimum intensity value of the emission beam EB2. In other words, as shown in FIG. 8, a curve C1 representing an intensity of the emission beam EB2 may have the actual minimum intensity value at or near the center C region. The intensity profile of the emission beam EB2 may be obtained by measuring the intensity of the emission beam EB2 using, for example, an image sensor at each point of an intersectional region between the emission beam EB2 and a plane perpendicular to a propagation direction thereof.

According to example embodiments of the inventive concept, the second intensity I2 value may be a sufficiently high intensity level to selectively melt at least one of the layers (e.g., a silicon layer) constituting the multi-layered structure of the photomask. At the same time, the second intensity level I2, as well as the first intensity level I1 are insufficient to melt another one of the layers (e.g. a molybdenum layer) constituting the multi-layered structure. As will be described with reference to FIG. 16, in some embodiments, the first intensity I1 may be an intensity level of about 1.3 to about 15 times the second intensity I2. However, example embodiments of the inventive concept are not necessarily limited thereto, and the ratio may be varied in view of certain considerations such as properties of the laser beam LB (such as sectional profile, aspect ratio, and width), the time duration of the annealing process, the geometry of the target object, and thermal conductivity of the target object.

Figure 9:
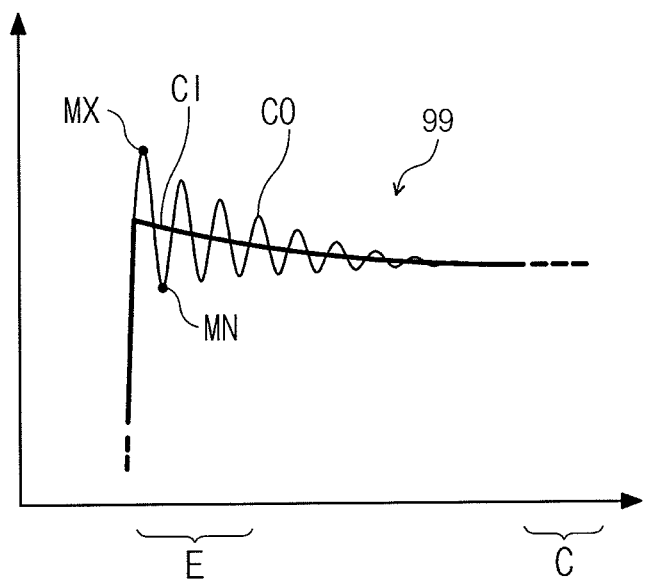

FIG. 9 illustrates an intensity distribution of a beam emitted from the beam intensity shaper according to example embodiments of the inventive concepts.

As depicted by a curve CO of FIG. 9, the emission beam EB2 may exhibit an oscillating intensity profile (e.g., as a function of distance from its center C). For example, the intensity curve CO of the emission beam EB2 may have local maxima MX and local minima MN that may alternate relative to a distance from its center.

In example embodiments, at least one of the local maxima MX may be an intensity value that is greater than the first intensity I1 and at least one of the local minima MN may be an intensity value that is less than the second intensity I2. In other example embodiments, one of the local maxima MX may be the first intensity I1, and one of the local minima MN may be equal to or greater than the second intensity I2.

According to some aspects of the inventive concept, although the emission beam EB2 may have an intensity that is smaller at its center C than at its edge E as described above, this feature may be found from a fitting curve obtained by interpolating the measured intensity of the emission beam EB2. Such an interpolated intensity value is referred to herein as an "average" or "relative average" intensity value. For example, if the measured intensity data of the emission beam EB2 are represented by the curve CO of FIG. 9, at least one of the local minima MN in the edge region E of the emission beam EB2 may be smaller than the second intensity I2 in the center region C as described above. At the same time, referring to the interpolation curve CI of FIG. 9, if the measured intensity data of the emission beam EB2 are interpolated or fitted to preserve monotonicity, the interpolation or fitting curve CI may have the minimum near the center C of the emission beam EB2. This reflects that the relative average intensity of the center region C is less than the relative average intensity of the edge region E of the emission beam EB2.

Figure 10:
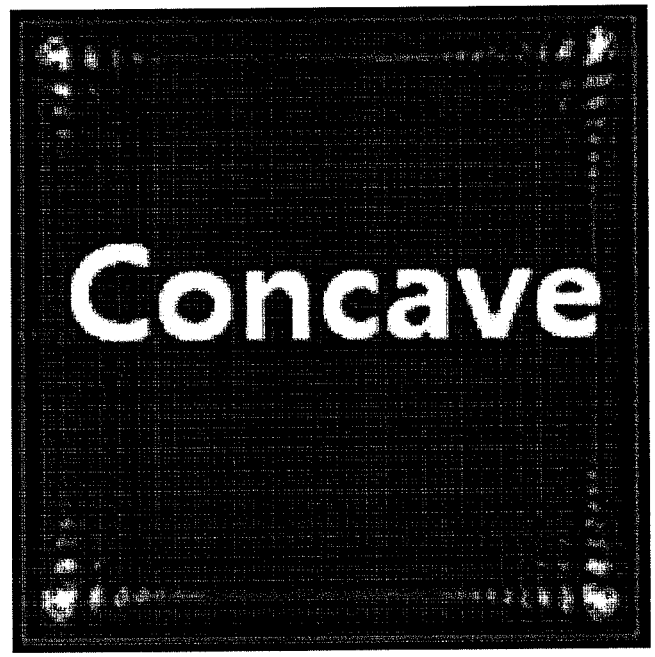

FIG. 10 is an image of a beam emitted from the beam intensity shaper according to example embodiments of the inventive concepts. In FIG. 10, it can be seen that the emission beam has a concave intensity profile.

Figure 11:
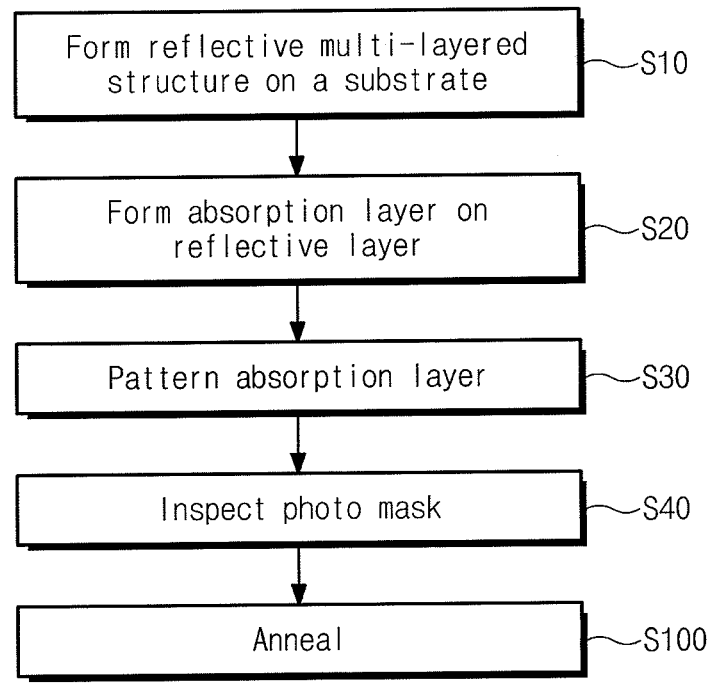
Figure 12:
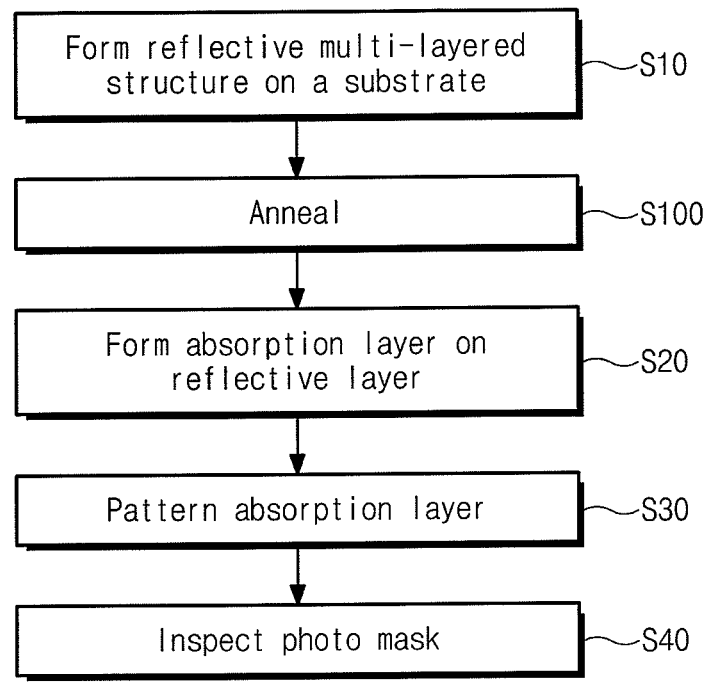
Figure 13:
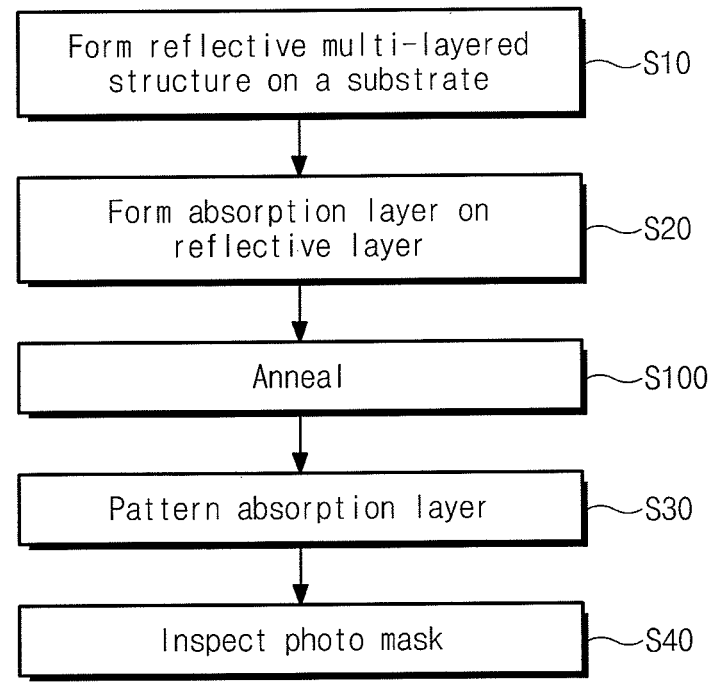

FIGS. 11-13 are flow charts illustrating methods of fabricating photomasks according to example embodiments of the inventive concepts.

A process of fabricating a photomask may include forming a reflective multi-layered structure on a substrate (in S10), forming an absorption layer on the reflective multi-layered structure (in S20), patterning the absorption layer to form an absorption pattern (in S30), and then, inspecting the photomask (in S40). According to example embodiments of the inventive concept, the fabricating process of the photomask may further include an annealing step S100, in which a thermal treatment using a laser beam is locally or globally performed to the reflective multi-layered structure, the absorption layer, and/or the photomask.

The annealing step S100 may be performed using the annealing system 1000 described with reference to FIGS. 1 through 9. In other example embodiments, at least one of the reflective multi-layered structure, the absorption layer, and/or the photomask may be illuminated, at least once, by a laser beam, or energy beam, having the concave intensity profile as described herein. In this case, the reflective multi-layered structure may be heated by a light energy of the laser beam, thereby exhibiting a modified optical property.

For example, the annealing step S100 may be performed to melt locally and selectively at least one of the layers constituting the reflective multi-layered structure. This melting may lead to a local or global change in reflectance of the photomask, and this may be applied to achieve certain technical goals. For example, the local or global change in reflectance of the photomask may be applied to improve uniformity in line width of the patterns to be formed on a wafer using the photomask.

Nevertheless, example embodiments of the inventive concept may not be limited to this specific application of the annealing step S100. For example, if the annealing step S100 is performed after forming the reflective multi-layered structure, there is no need to limit the order of performing the annealing step S100. In example embodiments, as shown in FIG. 11, the annealing step S100 may be performed on the photomask following the test step S40. In this case, the annealing step S100 may be performed based on test data obtained from the test step S40 and as a result of its analysis. In other example embodiments, the annealing step S100 may be performed between the steps S10 and S20 of forming the reflective multi-layered structure and the absorption layer, as shown in FIG. 12, or between the steps S20 and S30 of forming the absorption layer and the absorption pattern, as shown in FIG. 13.

Figure 14:
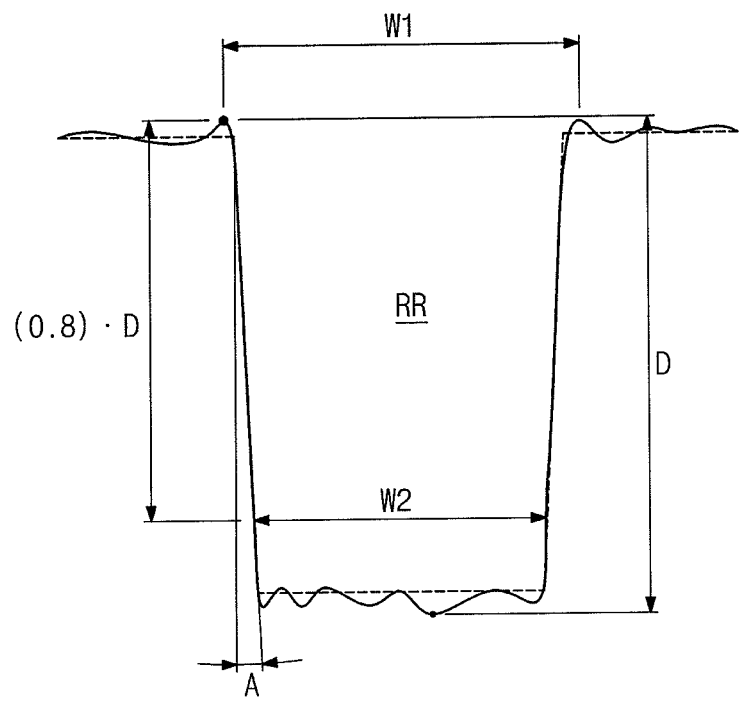

FIG. 14 is a depth profile property of a photomask fabricated using a fabrication method according to example embodiments of the inventive concepts.

As described with reference to FIGS. 11 through 13, the annealing system 1000 may be utilized for performing the annealing step S100 on the photomask. In this case, the reflective multi-layered structure may be locally melted during the annealing step S100, thereby having a reduced thickness. For example, as exemplarily shown in FIG. 14, the resulting reflective multi-layered structure may have a recess region RR, a top surface of which is partially recessed, as compared with that of a neighboring region.

As shown in FIG. 14, the recess region RR may be formed to have substantially a rectangular-like vertical section. For example, an angle A of a sidewall of the recess region RR may range from about 75 degree to about 90 degree or from about 80 degree to about 90 degree relative to the horizontal axis of the photomask, or 0 to 15 degrees relative to the vertical axis. According to some aspects of the inventive concepts, the recess region RR may be formed so that widths W2 and W1 of the recess region RR to be measured at two different levels can have a width ratio W2/W1 ranging from about 0.8 to 1.0 or from about 0.9 to 1.0. Here, the width W1 may be measured at a top entrance level of the recess region RR, and the width W2 may be measured at approximately 80 percent of the maximum depth D of the recess region RR.

In the case where the photomask is locally heated by the laser beam or annealing energy beam, a cooling rate or heat dissipation rate of the heated region may be dependent on the position. For example, it has been observed that the cooling rate may be lower at a center of the heated region than at edge portions of the heated region. This spatial difference in the cooling rate may lead to deterioration in thickness uniformity of the heated region.

According to example embodiments of the inventive concept, a laser beam to be incident onto the photomask can have an intensity profile capable of compensating of such a spatial difference in the cooling rate. The intensity profile of the laser beam LB described with reference to FIGS. 7 through 9 may be selected to satisfy this requirement. For example, the intensity curve C1 or the interpolation curve CI of the emission beam EB2 described with reference to FIGS. 8 and 9 may have a slope or curve configured to compensate for the spatial difference in the cooling rate of the heated region of the thereby heat-treated photomask.

The cooling rate of the heated region of the photomask may depend on several factors, including, for example, the shape of the heated region, the level of energy to be supplied in the energy beam, the time duration of the supplied energy beam, and the structure and thermal conductivity of the target object. Accordingly, the desired intensity profile for realizing the required compensation should be carefully considered. In view of this, some additional technical features related to the intensity profile for realizing the required compensation will be exemplarily described with reference to FIG. 15.

Figure 15:
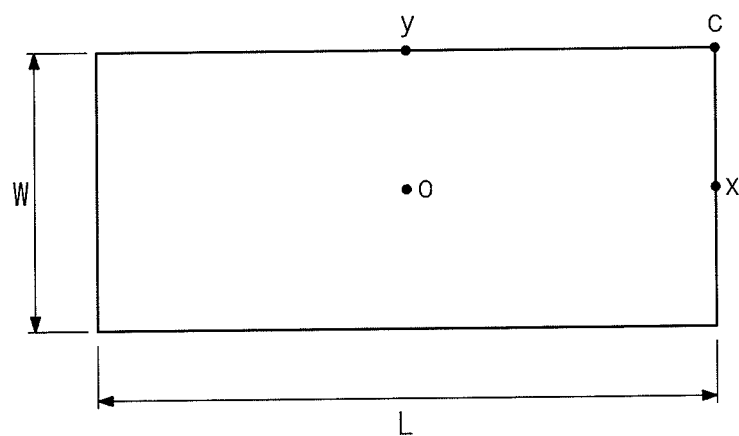
Figures 16, 17:
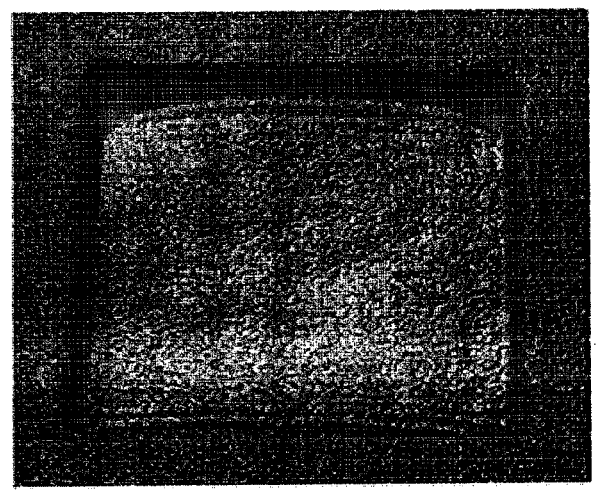

FIGS. 15 and 16 are a diagram and table, respectively, which are provided to describe certain aspects of a beam intensity shaper according to example embodiments of the inventive concepts.

In FIGS. 15 and 16, dimensions L and W represent the spatial length and width of a laser beam to be incident into the target object, for example, the length and width of the laser beam in the x-axis and y-axis directions of FIGS. 2 and 7. In FIG. 15, points o and c represent positions of a center and a corner, respectively, of the laser beam, and points x and y represent positions of centers of x- and y-sides, respectively, of the laser beam. In FIG. 16, Io, Ix, Iy and Ic represent intensities of the laser beam at the points o, x, y, and c respectively. FIG. 16 indicates the results of simulation and demonstrates examples of a beam intensity profile for realizing compensation as described herein. In the simulation, the laser beam was assumed to have a power density of about 2.4 kW/cm$^2$. In addition, the laser beam was considered to have sectional areas of 500 μm×250 μm (corresponding to the aspect ratio of 1:2 in FIG. 16) and 500 μm×50 μm (corresponding to the aspect ratio of 1:10 in FIG. 16).

Referring to FIGS. 15 and 16, as pulse duration of the laser beam increased from 0.1 ms to 100 ms, intensity ratios Ic/Io, Ix/Io and Iy/Io of the edges to the center of the laser beam were increased. Furthermore, an increase in the aspect ratio W:L of the laser beam may lead to an increase or decrease in the intensity ratios Ic/Io, Ix/Io and Iy/Io of the edges to the center. Although as described above the intensity profile for realizing the required compensation can be difficult to ascertain, it can be said at least from the simulation result that thermal non-uniformity in the simulated cases may be effectively compensated when the intensity ratios Ic/Io, Ix/Io and Iy/Io of the edges to the center are in a range from 1.3 to 15.

Figure 18:
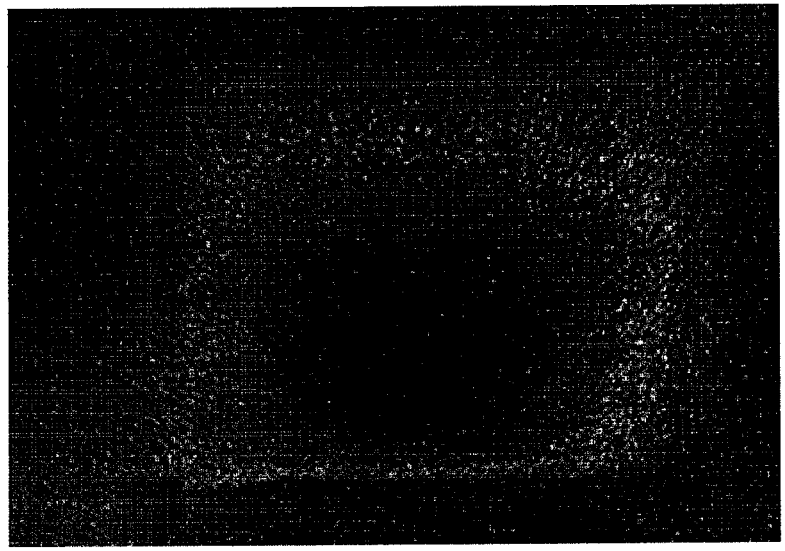
Figure 19:
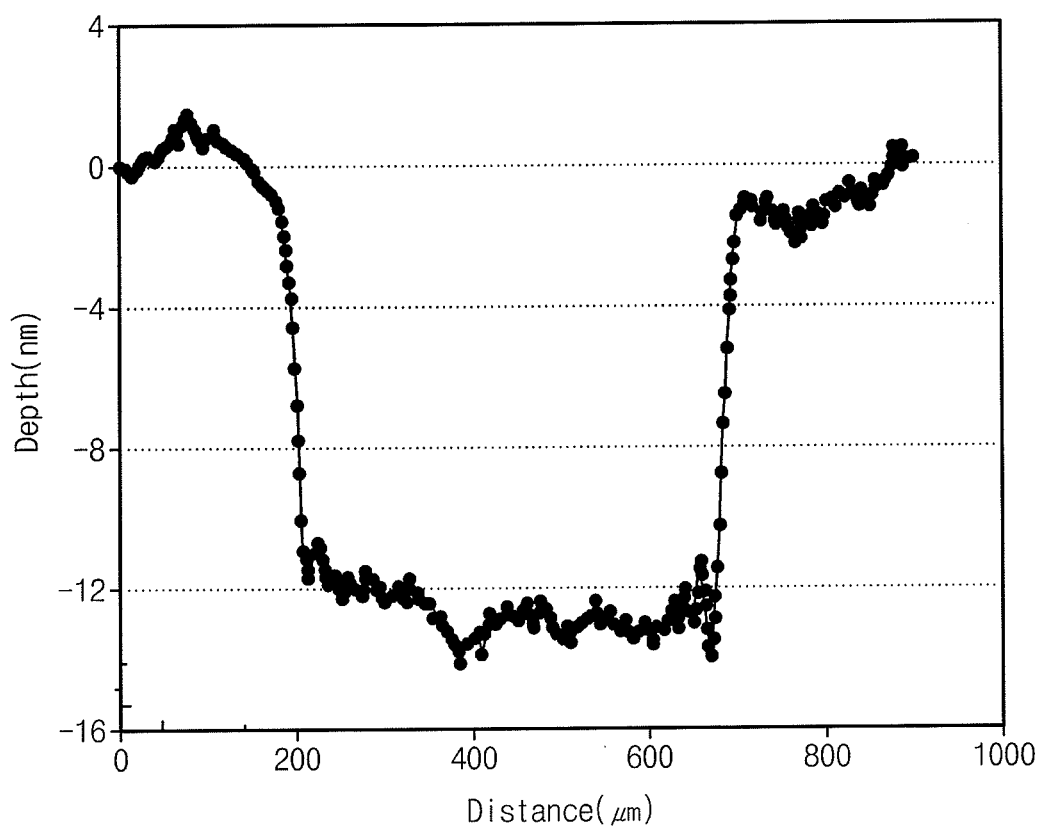
Figure 20:
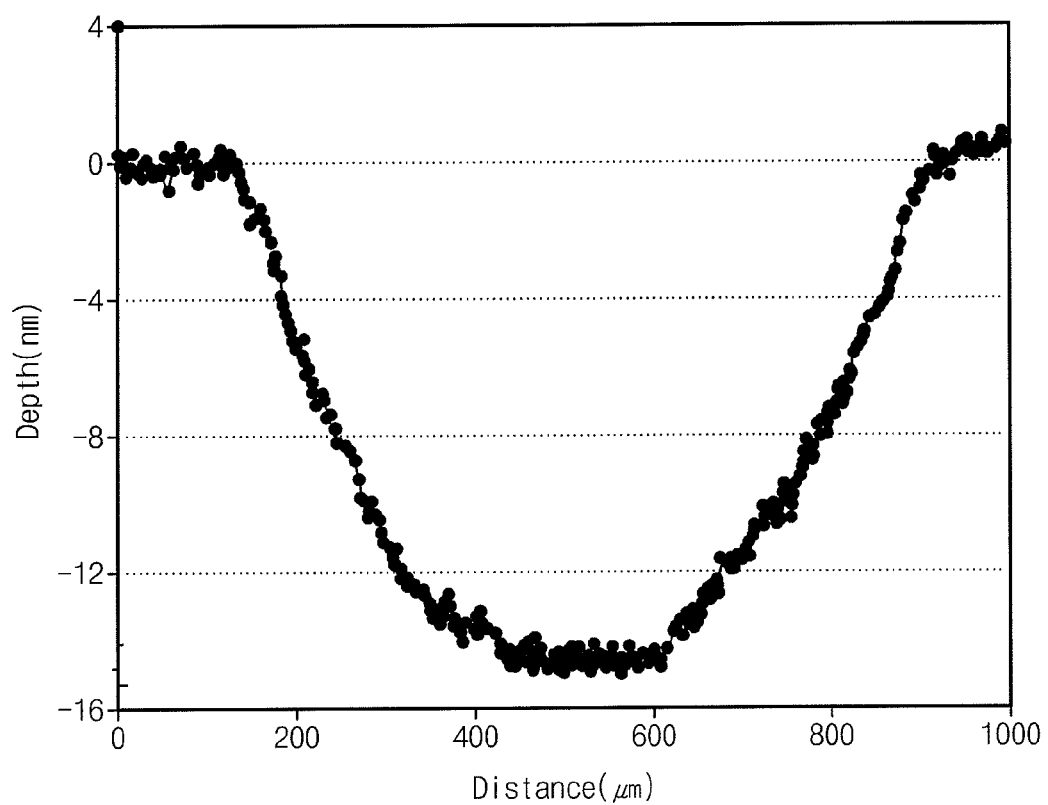

FIG. 17 is an image of a portion of a photomask according to example embodiments of the inventive concepts. FIG. 18 is an image of a portion of a photomask according to a comparative example. FIG. 19 is an graph of a depth profile measured from a photomask according to example embodiments of the inventive concept. FIG. 20 is a graph of a depth profile measured from a photomask according to the comparative example.

The example of FIG. 17 employing example embodiments of the present inventive concepts was obtained using an energy beam having a concave intensity profile, as described herein, while the comparative example was obtained using a laser beam with a uniform intensity, or with a relatively flat intensity profile (for example, a TOPHAT laser beam). Other than this, there was no difference in experimental conditions between the experimental and comparative examples.

As shown in FIGS. 17 and 19, the recessed region of the photomask according to the experimental example exhibited excellent thickness uniformity. For example, assuming Dmax and Dmin represents the maximum and minimum depths of the recessed region and the thickness uniformity is expressed by a formula of (Dmax−Dmin)/(Dmax+Dmin)*100, the measured thickness uniformity was about 11%. By contrast, as shown in FIGS. 18 and 20, the recessed region of the photomask according to the comparative example exhibited relatively poor thickness uniformity (e.g., about 52%). This experiment demonstrates that the thickness uniformity of the thermally-treated region of the photomask can be improved at least five times by employing the annealing system according to example embodiments of the inventive concept.

Figure 21:
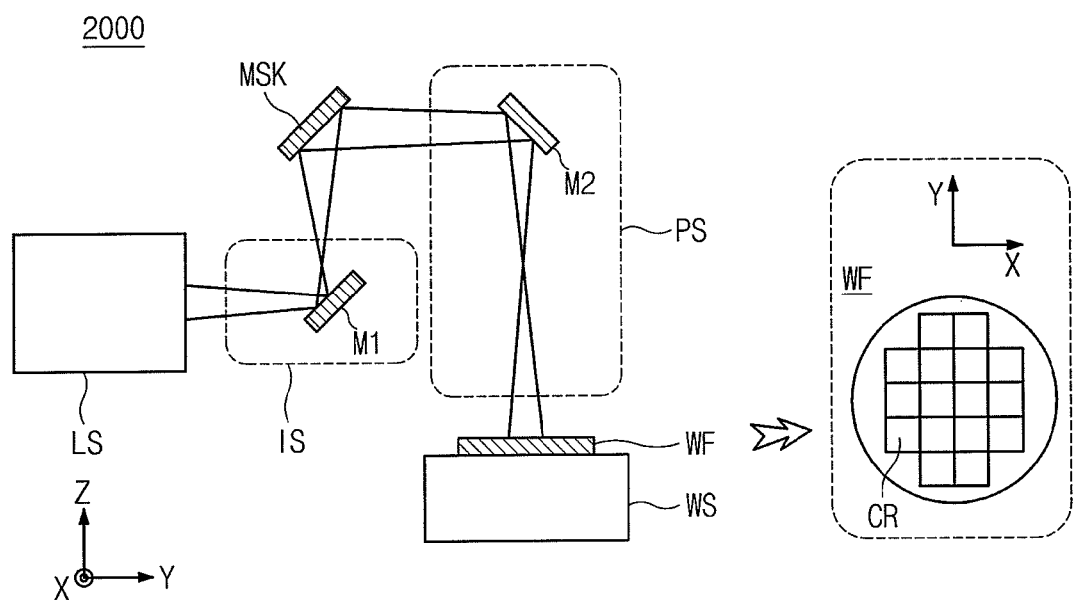

FIG. 21 is a schematic diagram of an exposure system according to example embodiments of the inventive concepts.

Referring to FIG. 21, an exposure system 2000 may include a light source LS, an illuminating system IS including at least one reflection element M1, the reflective photomask MSK, a projection system PS including at least one reflection element M2, a wafer stage WS to load a wafer WF. The wafer WF may include a plurality of chip regions CR to be divided into, and sold as, semiconductor devices (e.g., chips).

The light source LS may be configured to generate an electromagnetic wave having a wavelength in the range of wavelengths of extreme ultraviolet (EUV) light energy. For example, in the light source LS, a high-power laser may be used to produce plasma emitting the electromagnetic wave having a wavelength range of extreme ultraviolet light.

Since the electromagnetic wave emitted from the light source LS has the wavelength range of extreme ultraviolet light, each of the illuminating system IS and the projection system PS may be configured to be a reflecting optical system including at least one a reflection element (e.g., mirrors M1 and M2).

The reflective photomask MSK may be manufactured using one of the fabrication methods described with reference to FIGS. 11 through 13. In other words, the reflective photomask MSK may include at least one portion treated using the annealing system 1000 of FIG. 1 or using the laser beam emitted from the beam intensity shaper BSZ of FIGS. 7 through 10.

Figure 22:
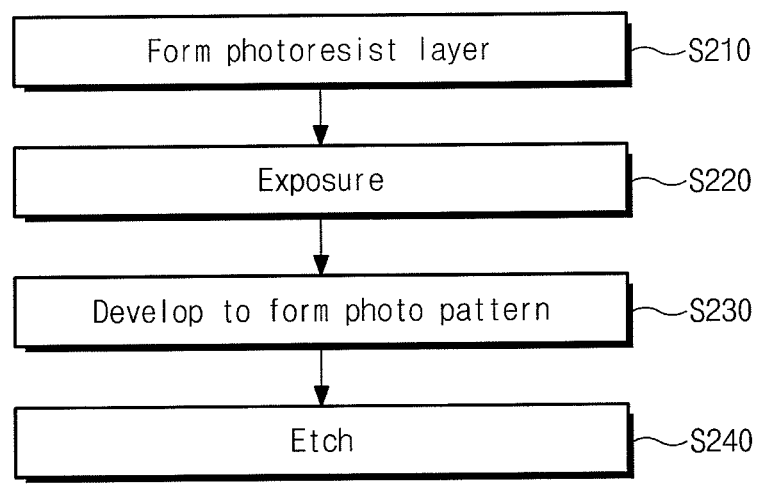

FIG. 22 is a flow chart illustrating a process of patterning a semiconductor device according to example embodiments of the inventive concepts.

Referring to FIG. 22, a photo-resist layer may be formed on a substrate (in S210). The photo-resist layer may be formed of a material, the chemical structure of which can be changed by an extreme ultraviolet light. An exposure step may be performed on the photo-resist layer (in S220), and then, the photo-resist layer may be developed to form a photo-resist pattern (in S230). Thereafter, the substrate or a layer provided thereon may be etched using the photo-resist pattern as an etch mask (in S240). The etching step S240 may be performed using one of anisotropic or isotropic etching techniques.

According to example embodiments of the inventive concepts, the exposure step S220 may be performed using the exposure system 2000 of FIG. 21. In other words, the exposure step S220 may be performed by a reflective exposure system employing an extreme ultraviolet light energy source. For example, a photomask treated using the annealing system of FIG. 1 may be used for the exposure step S220.

According to example embodiments of the inventive concepts, the beam shaper may be configured to emit an energy beam, an intensity of which is lower at a center thereof than at an edge thereof. For example, the energy beam may have an intensity profile capable of compensating for a spatial difference in cooling rate of a target platform. Accordingly, it is possible to improve thermal uniformity of a region that is treated by the annealing system according to example embodiments of the inventive concepts. For example, as the result of using the annealing system according to example embodiments of the inventive concepts, it is possible to control a thickness of the reflective photomask with improved uniformity and to control reflectance of the reflective photomask with improved preciseness. Furthermore, such systems and methods enable an improvement in width uniformity of patterns to be formed on a wafer, chip, or substrate.

While example embodiments of the inventive concepts have been particularly shown and described, it will be understood by one of ordinary skill in the art that variations in form and detail may be made therein without departing from the spirit and scope of the attached claims.

What is claimed is:

1. A treatment system comprising:
an energy source that generates a energy beam that is emitted along an energy beam pathway;
a beam section shaper positioned along the energy beam pathway that receives an incident energy beam and modifies a section shape thereof to output a shape-modified energy beam; and
a beam intensity shaper positioned along the energy beam pathway that receives an incident energy beam having a first intensity profile and outputs an intensity-modified energy beam having a second intensity profile, wherein the first intensity profile has a relative maximum average intensity at a center region thereof and wherein the second intensity profile has a relative minimum average intensity at a center region thereof.

2. The treatment system of claim 1, further comprising:
a stage positioned along the energy beam pathway at which a substrate is positioned and at which the intensity-modified energy beam is incident.

3. The treatment system of claim 2 wherein the stage is constructed and arranged to receive the substrate.

4. The treatment system of claim 3 wherein the substrate comprises one or more of a photomask and wafer.

5. The treatment system of claim 3 wherein the substrate comprises a chip.

6. The treatment system of claim 2 wherein the stage is constructed and arranged to receive the substrate comprising a multiple-layer absorber-type Mo/Si photomask in turn constructed and arranged for use in an extreme ultraviolet (EUV) reflective-type photolithographic process.

7. The treatment system of claim 2 wherein the intensity-modified energy beam incident at the substrate causes a heat treatment of a target region of the substrate.

8. The treatment system of claim 7 wherein the heat treatment imparts heating of the substrate to a first temperature that is substantially constant in the target region.

9. The treatment system of claim 8 wherein the first temperature is greater than a temperature required to melt a first material on the substrate.

10. The treatment system of claim 9 wherein the first material is an Si layer that is melted as a result of heating to the first temperature.

11. The treatment system of claim 8 wherein the first temperature is less than a temperature required to melt a second material on the substrate.

12. The treatment system of claim 11 wherein the second material is an Mo layer that is not melted as a result of heating to the first temperature.

13. The treatment system of claim 8 wherein the heat treatment results in heating of the substrate to a second temperature that is less than the first temperature in a region beyond the target region.

14. The treatment system of claim 13 wherein the second temperature is less than a temperature required to melt a material on the substrate.

15. The treatment system of claim 1, wherein the beam section shaper comprises an optical element selected from the group consisting of: a lens, a reflector, a diffractive optical element (DOE), a spatial light modulator (SLM), and a digital mirror device (DMD).

16. The treatment system of claim 1, wherein the beam intensity shaper comprises an optical element selected from the group consisting of: a lens, a reflector, a diffractive optical element (DOE), a spatial light modulator (SLM), and a digital mirror device (DMD).

17. The treatment system of claim 1 wherein the energy source comprises a laser source and wherein the energy beam is a laser beam.

18. The treatment system of claim 1 wherein the energy beam incident at the beam intensity shaper has an intensity distribution such that an intensity at a center region is greater than an intensity at an edge region thereof.

19. The treatment system of claim 18 wherein the energy beam incident at the beam intensity shaper has a Gaussian intensity distrib1f.

20. The treatment system of claim 1 wherein the intensity-modified energy beam has an intensity distribution that is concave.

21. The treatment system of claim 20 wherein the concave intensity distribution has a first average intensity at an edge region and a second average intensity at the center region and wherein the first average intensity is about 1.3 to about 15 times the second average intensity.

22. The treatment system of claim 21 wherein the second intensity is sufficient for melting a material on a substrate at which the intensity-modified energy beam is incident.

23. The treatment system of claim 1 wherein the shape-modified energy beam output by the beam section shaper is incident on the beam intensity shaper.

24. The treatment system of claim 1 wherein the intensity-modified energy beam output by the beam intensity shaper is incident on the beam section shaper.

25. The treatment system of claim 1 wherein the second intensity profile of the intensity-modified energy beam output by the beam intensity shaper has an oscillating distribution with local maxima and local minima.

26. The treatment system of claim 25 wherein the local minima of the second intensity profile is positioned in an edge region of the second intensity profile and wherein the local minima is less than the relative minimum average intensity at the center region thereof.

27. The treatment system of claim 25 wherein the local maxima of the second intensity profile is positioned in an edge region of the second intensity profile and wherein the local maxima is greater than an average intensity at the edge region.

28. The treatment system of claim 27 wherein the average intensity at the edge region of the second intensity profile is determined according to a curve fitting of the oscillating profile.

* * * * *